United States Patent
Cadag et al.

(10) Patent No.: US 12,211,774 B2
(45) Date of Patent: Jan. 28, 2025

(54) LEAD STABILIZATION IN SEMICONDUCTOR PACKAGES

(71) Applicant: STMICROELECTRONICS, INC., Calamba (PH)

(72) Inventors: Ela Mia Cadag, Calamba (PH); Frederick Ray Gomez, Calamba (PH); Aaron Cadag, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 26 days.

(21) Appl. No.: 16/848,635

(22) Filed: Apr. 14, 2020

(65) Prior Publication Data

US 2020/0343168 A1    Oct. 29, 2020

Related U.S. Application Data

(60) Provisional application No. 62/838,814, filed on Apr. 25, 2019.

(51) Int. Cl.
*H01L 23/498*    (2006.01)
*H01L 21/48*    (2006.01)
*H01L 23/00*    (2006.01)

(52) U.S. Cl.
CPC .... *H01L 23/49811* (2013.01); *H01L 21/4828* (2013.01); *H01L 23/49838* (2013.01); *H01L 24/45* (2013.01)

(58) Field of Classification Search
CPC ...................... H01L 23/49811; H01L 23/49838
See application file for complete search history.

(56) References Cited

U.S. PATENT DOCUMENTS

| | | | | | |
|---|---|---|---|---|---|
| 5,233,220 | A | * | 8/1993 | Lamson | H01L 24/06 257/784 |
| 5,466,888 | A | * | 11/1995 | Beng | H01L 23/4951 174/533 |
| 6,104,083 | A | * | 8/2000 | Ito | H01L 24/06 438/123 |
| 9,631,481 | B1 | | 4/2017 | Bae et al. | |

(Continued)

FOREIGN PATENT DOCUMENTS

| CN | 208478317 U | | 2/2019 |
|---|---|---|---|
| CN | 109427723 A | | 3/2019 |
| KR | 20100042394 A | * | 4/2010 |

OTHER PUBLICATIONS

Definition of "abut", http://www.dictionary.com (2021) (Year: 2021).*

(Continued)

*Primary Examiner* — Michele Fan
(74) *Attorney, Agent, or Firm* — Seed IP Law Group LLP

(57) ABSTRACT

Generally described, one or more embodiments are directed to semiconductor packages comprising a plurality of leads and methods of forming same. The plurality of leads include active leads that are electrically coupled to bond pads of a semiconductor die and thereby coupled to active components of the semiconductor die, and inactive leads that are not electrically coupled to bond pads of the semiconductor die. The active leads have surfaces that are exposed at a lower surface of the semiconductor package and forms lands, while the inactive leads are not exposed at the lower surface of the package.

18 Claims, 8 Drawing Sheets

(56) References Cited

U.S. PATENT DOCUMENTS

| | | | |
|---|---|---|---|
| 2007/0114645 A1* | 5/2007 | Punzalan | H01L 23/562 257/678 |
| 2008/0135991 A1* | 6/2008 | Harnden | H01L 23/49503 257/666 |
| 2008/0283980 A1 | 11/2008 | Gao et al. | |
| 2008/0303123 A1* | 12/2008 | Camacho | H01L 23/49575 257/670 |
| 2010/0320590 A1* | 12/2010 | Camacho | H01L 23/4951 257/692 |
| 2017/0141014 A1 | 5/2017 | Cadag et al. | |
| 2017/0186674 A1 | 6/2017 | Luan | |
| 2017/0278876 A1 | 9/2017 | Takahashi et al. | |
| 2017/0309550 A1 | 10/2017 | Danno et al. | |
| 2017/0338170 A1 | 11/2017 | Ziglioli | |

OTHER PUBLICATIONS

Definition of "rest", http://www.dictionary.com (2021) (Year: 2021).*
Definition of "rest", http://www.merriam-webster.com (2021) (Year: 2021).*
Definition of "rest", https://dictionary.cambridge.org/us/dictionary/english/ (2021) (Year: 2021).*

* cited by examiner

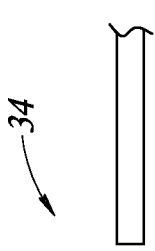
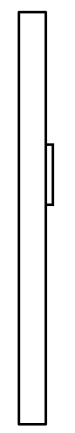
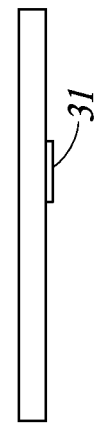
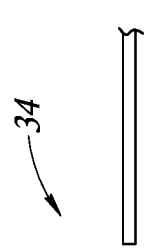
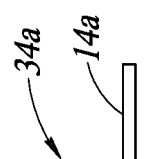
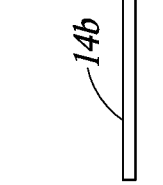
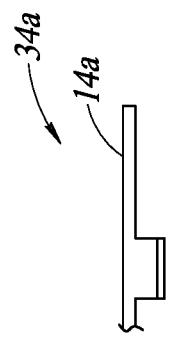
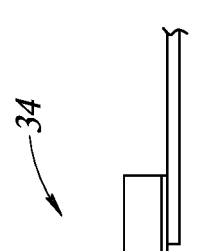
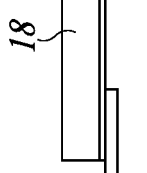
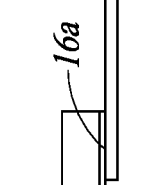
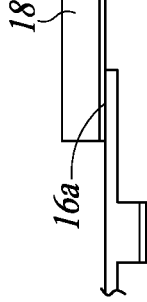

LEAD STABILIZATION IN SEMICONDUCTOR PACKAGES

BACKGROUND

Technical Field

Embodiments of the present disclosure are directed to semiconductor packages and methods of assembling same.

Description of the Related Art

Leadless (or no lead) packages are often utilized in applications in which small sized packages are desired. Typically, the flat leadless packages provide a near chip scale encapsulated package formed from a planar leadframe. Lands located on a lower surface of the package provide electrical connection to another device, such as a printed circuit board (PCB). Leadless packages, such as quad flat no-lead (QFN) packages, include a semiconductor die or chip mounted to a support surfaces of a leadframe, such as a die pad or ends of leads. The semiconductor die is electrically coupled to the leads, often by conductive wires.

The process of wire bonding the conductive wires may involve heat and ultrasonic energy. Due to instability of the leads, a bouncing effect may occur while the conductive wires are bonded to the leads. The bouncing effect may be exacerbated by the ultrasonic energy that is introduced during the bonding process and may result in a weaker bond between the lead and the conductive wire. Thus, improvements are desired.

BRIEF SUMMARY

Generally described, one or more embodiments are directed to semiconductor packages comprising a plurality of leads and methods of forming same. The plurality of leads include active leads that are electrically coupled to bond pads of a semiconductor die and thereby coupled to active components of the semiconductor die, and inactive leads that are not electrically coupled to bond pads of the semiconductor die. The active leads have surfaces that are exposed at a lower surface of the semiconductor package and forms lands, while the inactive leads are not exposed at the lower surface of the package. In one or more embodiments, the inactive leads provide additional stabilization during assembly, such as during die attach and wire bond processing.

The inactive leads have a reduced thickness relative to at least a portion of the active leads. In one embodiment, the inactive leads are half etched and only portions of the active leads are half etched. The entire thickness of each inactive lead is less than at least a portion of a thickness of the active leads. Both the inactive leads and the active leads may be exposed at side surfaces of the semiconductor packages. In at least one embodiment, the leads are formed from a leadframe and are symmetrically arranged about at least one axis of the leadframe, such as a central axis.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIGS. 4A-4F are cross-sectional views of the semiconductor package of FIG. 1A at various stages of assembly.

DETAILED DESCRIPTION

Generally described, one or more embodiments are directed to semiconductor packages comprising a plurality of leads and methods of forming same. The plurality of leads include active leads that are electrically coupled to bond pads of a semiconductor die and thereby coupled to active components of the semiconductor die, and inactive leads that are not electrically coupled to bond pads of the semiconductor die. The active leads have surfaces that are exposed at a lower surface of the semiconductor package and forms lands, while the inactive leads are not exposed at the lower surface of the package. In one or more embodiments, the inactive leads provide additional stabilization during assembly, such as during die attach and wire bond processing.

Figure 1A:
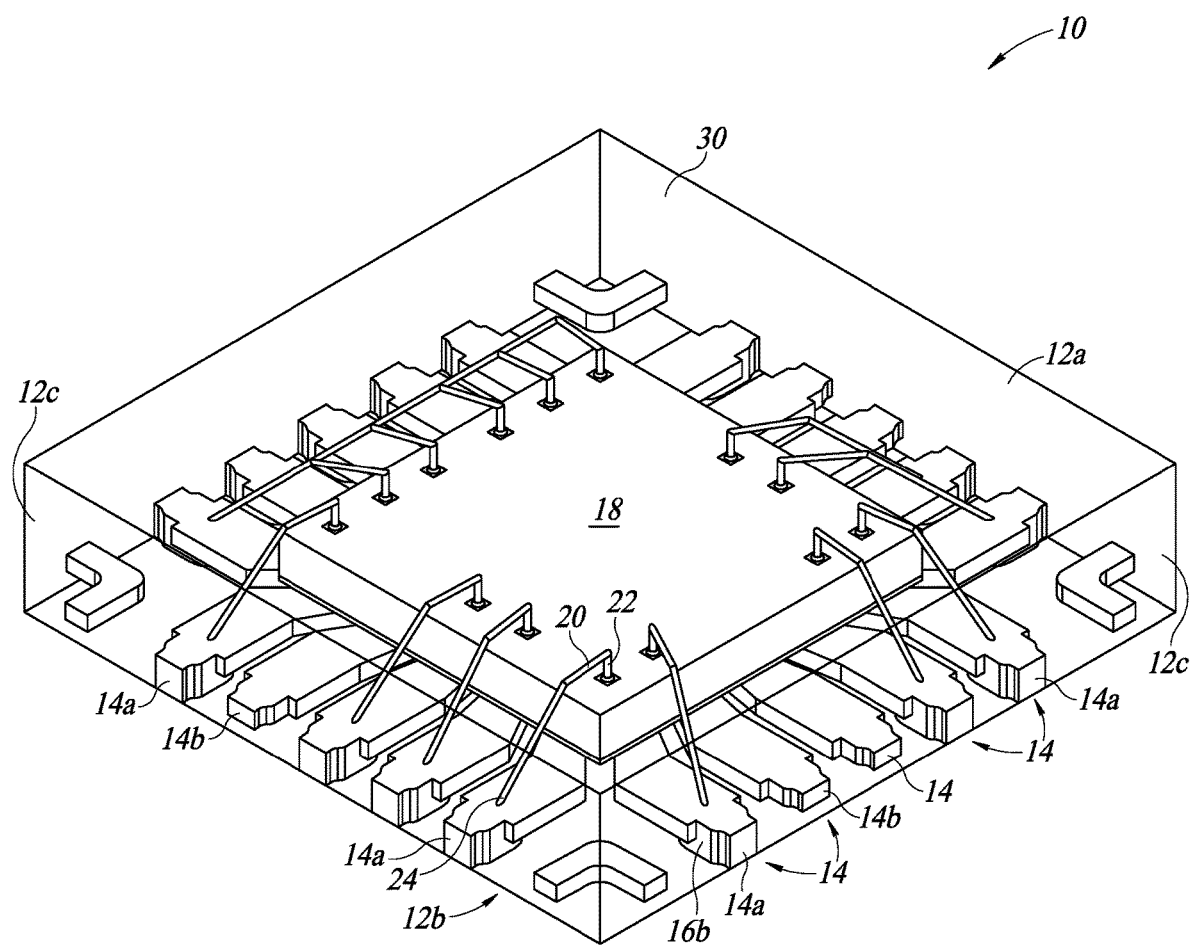
FIG. 1A is shows a top isometric view of a semiconductor package according to one embodiment.
Figure 1B:
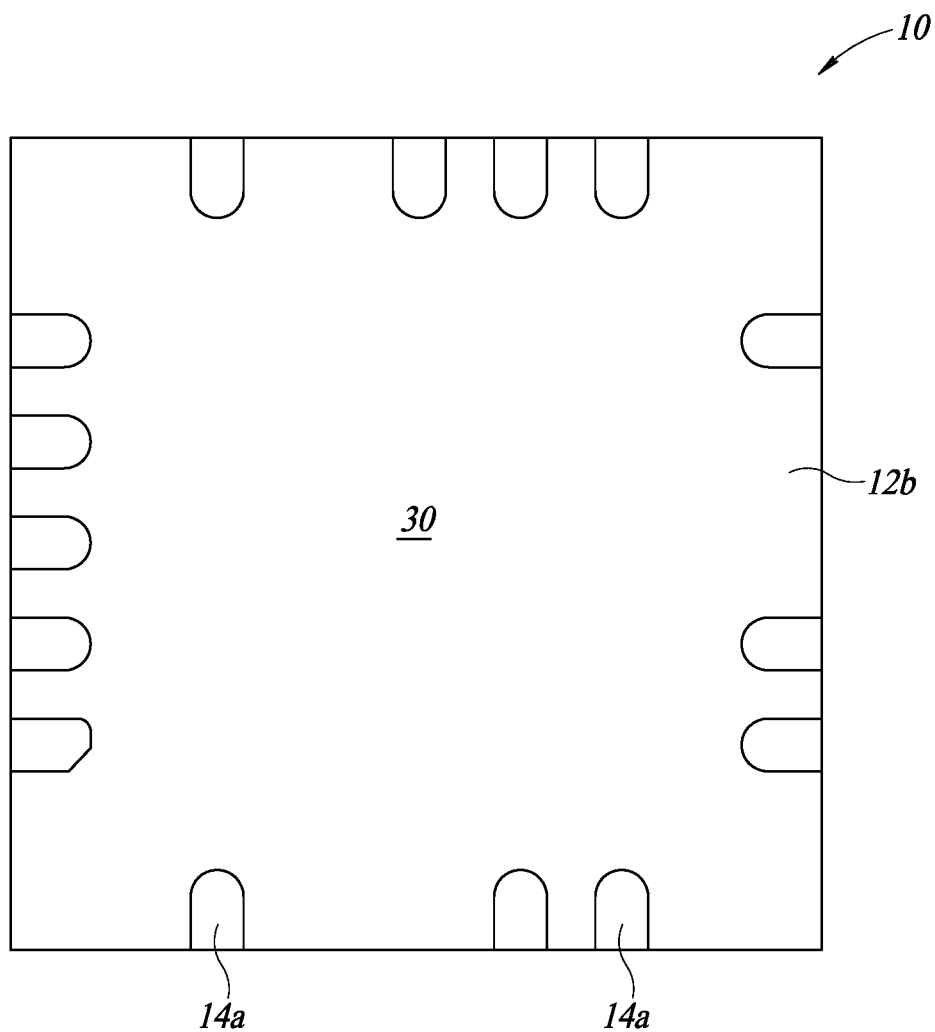
FIG. 1B is a bottom view of the semiconductor package of FIG. 1A.
Figure 1C:
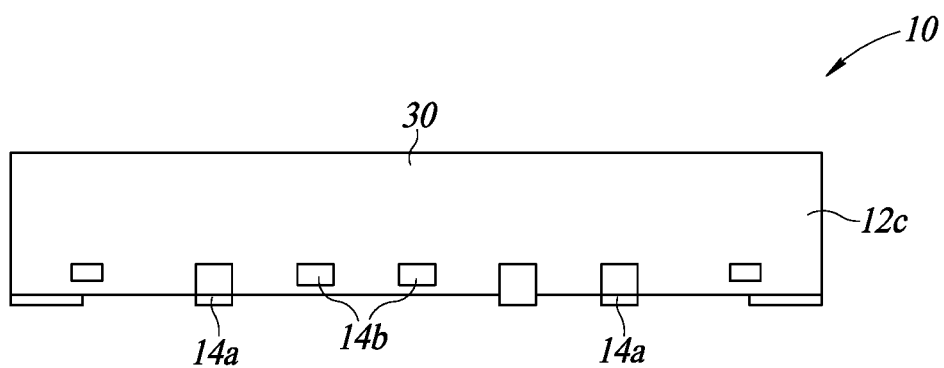
FIG. 1C is a side view of the semiconductor package of FIG. 1A.

FIG. 1A shows an isometric view of a semiconductor package 10 in accordance with one embodiment. The semiconductor package 10 is a chip-on-lead (COL) semiconductor package. FIG. 1B is a bottom view of the semiconductor package 10, and FIG. 1C is a side view of the semiconductor package 10.

The semiconductor package 10 includes an upper surface 12a, a lower surface 12b, and side surfaces 12c. The semiconductor package 10 includes a plurality of leads 14 having inner portions 16a (FIG. 4C) that support a semiconductor die or chip 18 and outer portions 16b that extend to the side surfaces 12c of the semiconductor package 10.

The semiconductor die 18 is made from semiconductor material, such as silicon, and includes an active surface integrating one or more electrical components, such as integrated circuits. The active surface of the semiconductor die 18 includes conductive bond pads that are electrically connected to one or more of the electrical components.

The semiconductor die 18 is coupled to the inner portions 16a of the plurality of leads 14 by a material configured to hold the semiconductor die 18 in place during assembly. In one embodiment, the semiconductor die 18 is coupled to the inner portions 16a of the plurality of leads 14 by an adhesive material, such as glue, paste, tape and the like. In other embodiments, the semiconductor die 18 is coupled to a die pad (not shown) that supports the semiconductor die and the plurality of leads are located around and spaced apart from the die pad as is well known in the art.

The plurality of leads 14 may be symmetrically arranged about one or more axes and may be symmetrically arranged about an axis of the semiconductor die 18. The plurality of leads 14 includes both active leads 14a and inactive leads 14b.

Although the semiconductor die 18 is coupled to both the active leads 14a and the inactive leads 14b for support, the active surface of the semiconductor die 18 is electrically coupled only to the active leads 14a. In particular, the bond pads of the semiconductor die 18 are electrically coupled to surfaces of the active leads 14a by conductive wires 20, respectively. For example, a first end 22 of a conductive wire 20 is coupled to a bond pad of the semiconductor die 18, and a second end 24 of the conductive wire 20 is coupled to a first surface of the active lead 14a.

As previously mentioned, the inactive leads 14b of the plurality of leads 14 are not electrically coupled to the active surface of the semiconductor die 18. Thus, the active leads 14a are electrically coupled to the integrated circuits of the active surface of the semiconductor die 18, while the inactive leads 14b are electrically decoupled from the integrated circuits of the active surface of the semiconductor die 18.

In other embodiments, the active surface of the semiconductor die 18 may be electrically coupled to the active leads 14a by other techniques, such as flip chip as is well known in the art. In such an embodiment, the semiconductor die is flipped over and faces the leads and conductive bumps are located between the active leads and the bond pads of the semiconductor die.

A package body 30 covers the semiconductor die 18 and the conductive wires 20 and portions of the leads 14. The package body 30 is an insulating material, such as an encapsulation material, that protects the electrical components of the semiconductor die and conductive wires from damage, such as corrosion, physical damage, moisture damage, or other causes of damage to electrical devices and materials. In some embodiment, the package body 30 is at least one of a polymer, silicone, resin, polyimide, and epoxy. The package body 30 is shown in FIG. 1A as transparent so that inner details of the semiconductor package 10 can be readily seen. The package body is, however, typically made of an opaque material.

With reference to FIG. 1B, the active leads 14a have second surfaces that are exposed from the package body 30 at the lower surface 12b of the semiconductor package 10 to form lands. Remaining portions of the active leads 14a are covered by the package body 30. The inactive leads 14b are not exposed from the package body 30 at the lower surface 12b of the semiconductor package 10 as best shown in FIG. 1B. Rather, the package body 30 covers the inactive leads 14b at the lower surface.

With reference to FIG. 1C, both the inactive leads 14b and the active leads 14a have surfaces that are exposed at side surfaces 12c of the semiconductor package 10. The surfaces of the inactive leads 14b and the active leads 14a may be flush with a surface of the package body 30. The surfaces of the active leads 14a extend along the respective side surface 12c of the semiconductor package 10 to the lower surface 12b of the semiconductor package 10, while the surfaces of the inactive leads 14b do not extend to the lower surface 12b of the semiconductor package 10. That is, the package body 30 is between the exposed surfaces of the inactive leads 14b and the lower surface 12b of the semiconductor package 10. As previously mentioned, the package body 30 covers surfaces of the inactive leads 14b at the lower surface 12b of the semiconductor package 10 so that surfaces of the inactive leads 14b are not exposed at the lower surface 12b of the semiconductor package 10.

As best shown in FIG. 1C, thicknesses of the active leads 14a and inactive leads 14b are different from each other. In at least one embodiment, the inactive leads 14b have a thickness that is about one half, such as between 40% to 60%, the thickness of the outer portions of the active leads 14a. As will be explained in more detail below, the inactive leads 14b provide stability during assembly of the semiconductor package 10. In at least one embodiment, the inactive leads 14b and the active leads 14a provide suitable support for the semiconductor die 18 during wire bonding.

The number and combination of active leads 14a may be different than is shown. Any number or combination of active leads 14a may be selected, including active leads being located along two sides, such as opposing sides, or along only one side of the semiconductor package. In general, which leads 14 are to be active leads 14a is determined by the application for the semiconductor package, typically based on customer specifications.

The active leads 14a have first and second thicknesses. The first thickness is at the inner portions 16a of the active leads 14a and the second thickness is at the outer portions 16b of the active leads 14a, which is best shown in FIG. 4F. The first thickness is less than the second thickness. In some embodiments, the first thickness is between 40% and 60%, and in one embodiment about 50%, the second thickness. As previously mentioned, the lower surfaces of the outer portions 16b of the active leads 14a form lands for coupling the semiconductor package to another device.

The inactive leads 14b have a constant thickness, which may be the same thickness as the first thickness of the active leads. The outer portions 16b of the inactive leads 14b have the first thickness, while the outer portions 16b of the active leads 14a have the second thickness, which is greater than the first thickness. The package body 30 covers the lower surfaces of the inactive leads 14b and the portions of the active leads 14a having the first thicknesses.

Figure 2A:
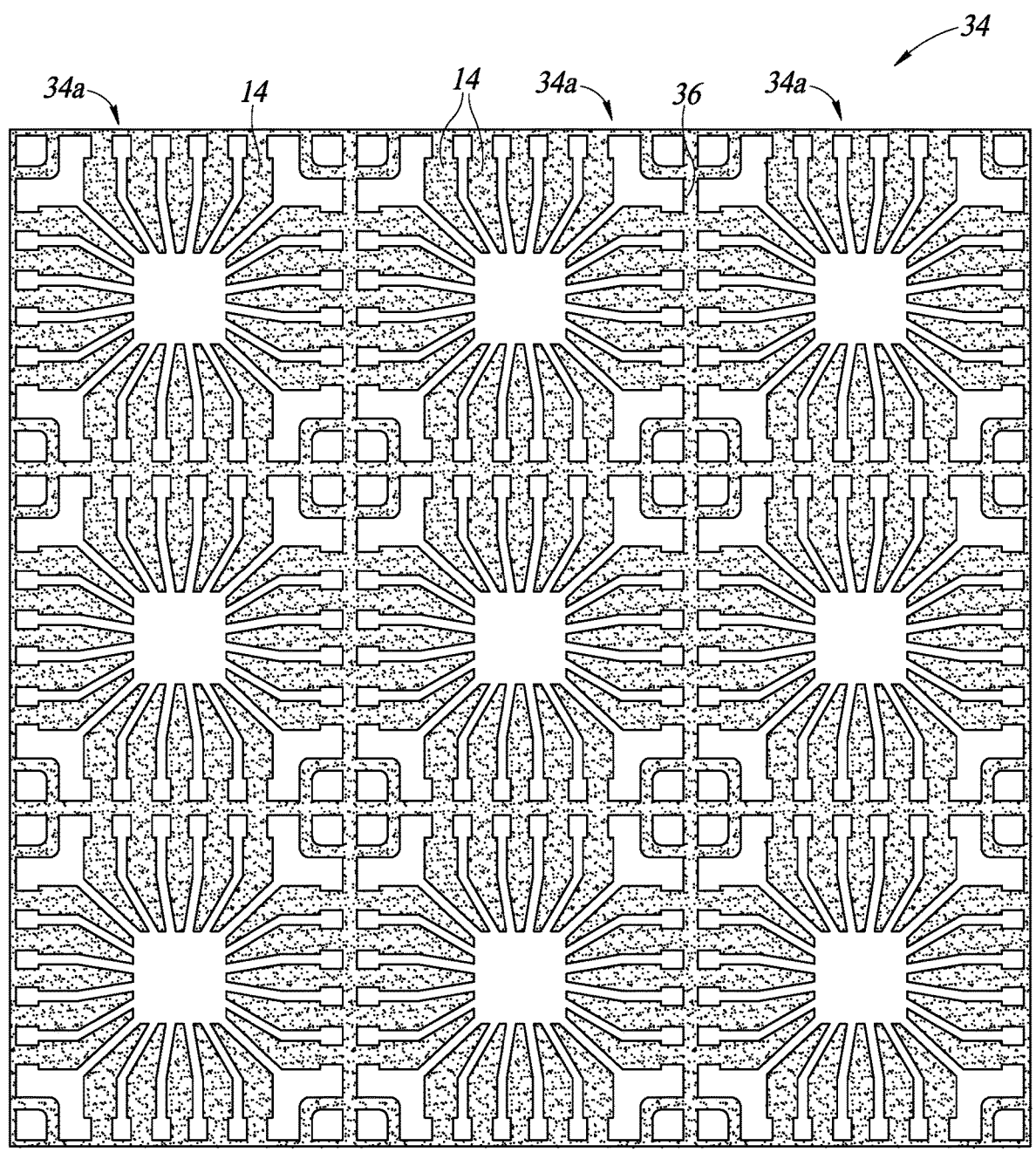
FIG. 2A is a top view of a leadframe array for forming the semiconductor package of FIG. 1A according one embodiment.
Figure 2B:
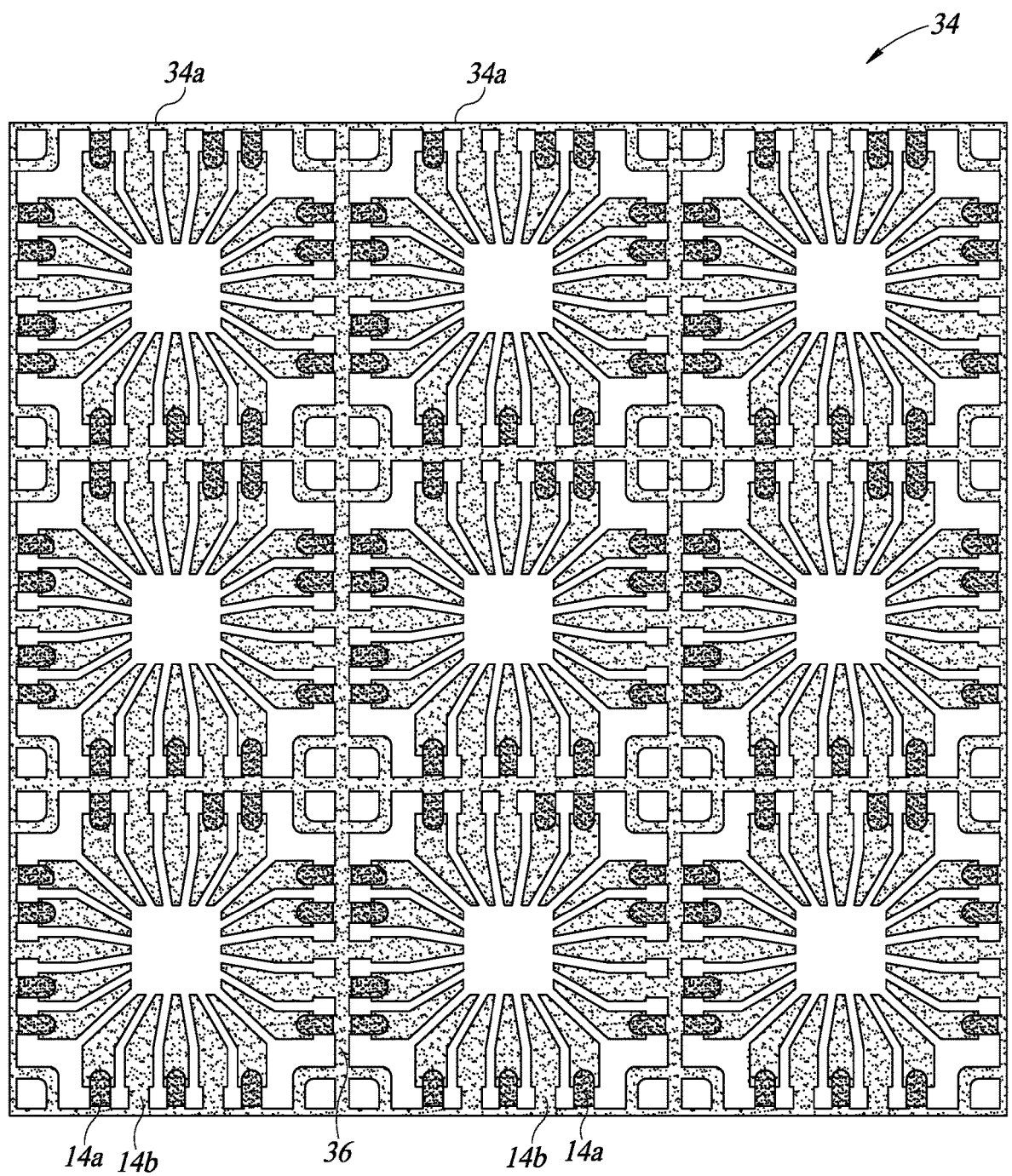
FIG. 2B is a bottom view of the leadframe array of FIG. 2A.

FIG. 2A shows an upper surface of a leadframe array 34 used for forming semiconductor packages, such as the semiconductor package 10 of FIGS. 1A-1C, according one embodiment. FIG. 2B shows a lower surface of the leadframe array 34 of FIG. 2A. The leadframe array 34 is made of conductive material, such as a metal. In at least one embodiment the leadframe array 34 is made of copper or a copper alloy. The leadframe 34 is shown with stippling to provide clarity as to which portions form the leadframe and which portions do not form the leadframe, and to show depth. In particular, the bottom view of the leadframe 34 includes thicker stippling to indicate thicker portions of the leadframe 34.

The leadframe array 34 includes a plurality of individual leadframes 34a arranged in columns and rows, each for forming a respective semiconductor package. The leads 14 of adjacent individual leadframes 34a are coupled together by connecting bars 36. In at least one embodiment, the leads 14 are arranged in a symmetrical arrangement about one or more axes, such as a central axis, of the individual leadframes 34a.

During assembly, the leads 14 of adjacent individual leadframes 34a provide suitable stabilization of any active leads during the wire bonding process. Active leads of adjacent individual leadframes may oppose each other at the connecting bars 36 or an inactive lead may oppose an active lead. Furthermore, by providing more leads than are used as active leads in the final semiconductor package, the assembly of the package is improved. In particular, the inactive leads provide stability during the wire bonding process.

Figure 3A:
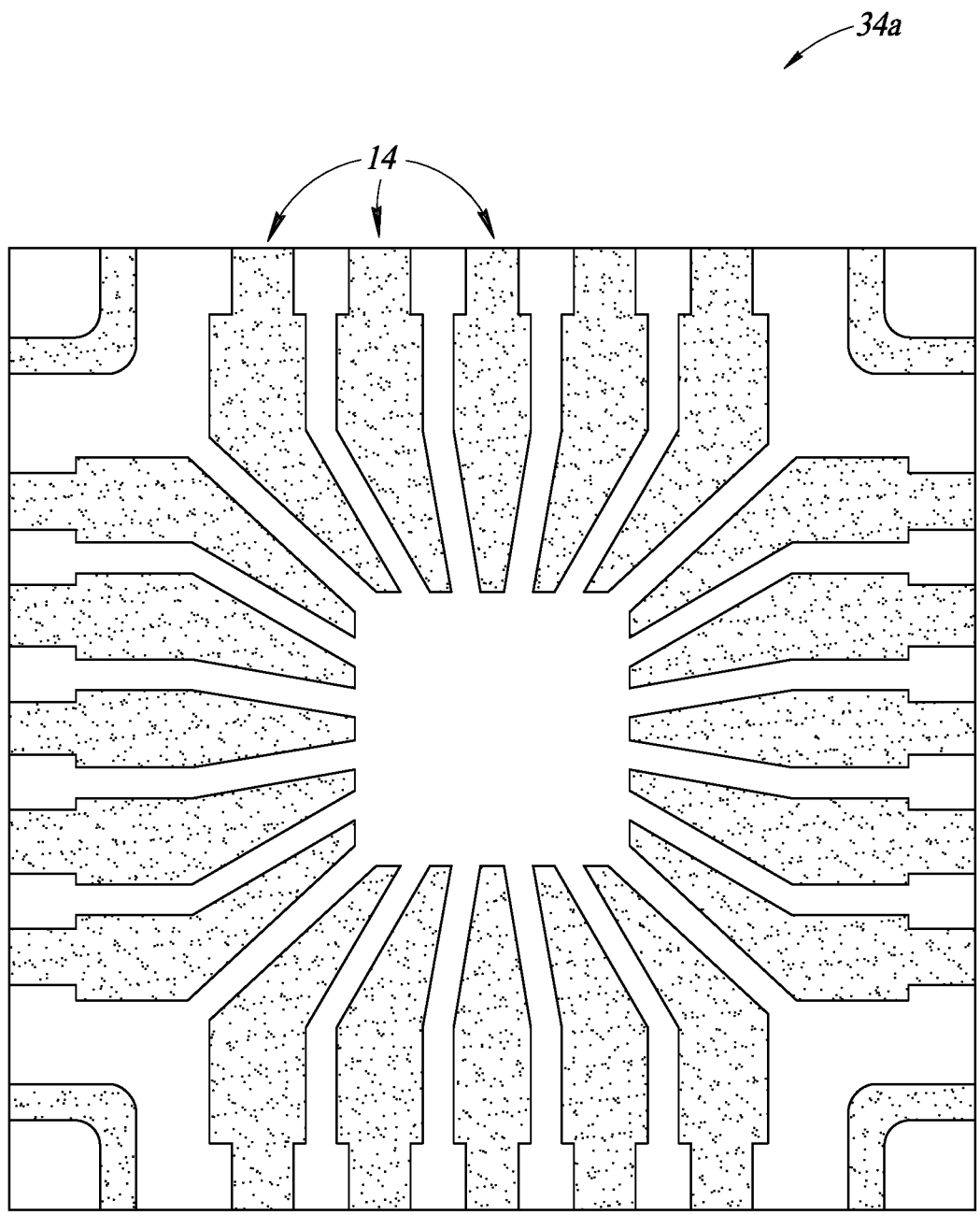
FIG. 3A is a top view of an individual leadframe of the leadframe array of FIG. 2A.
Figure 3B:
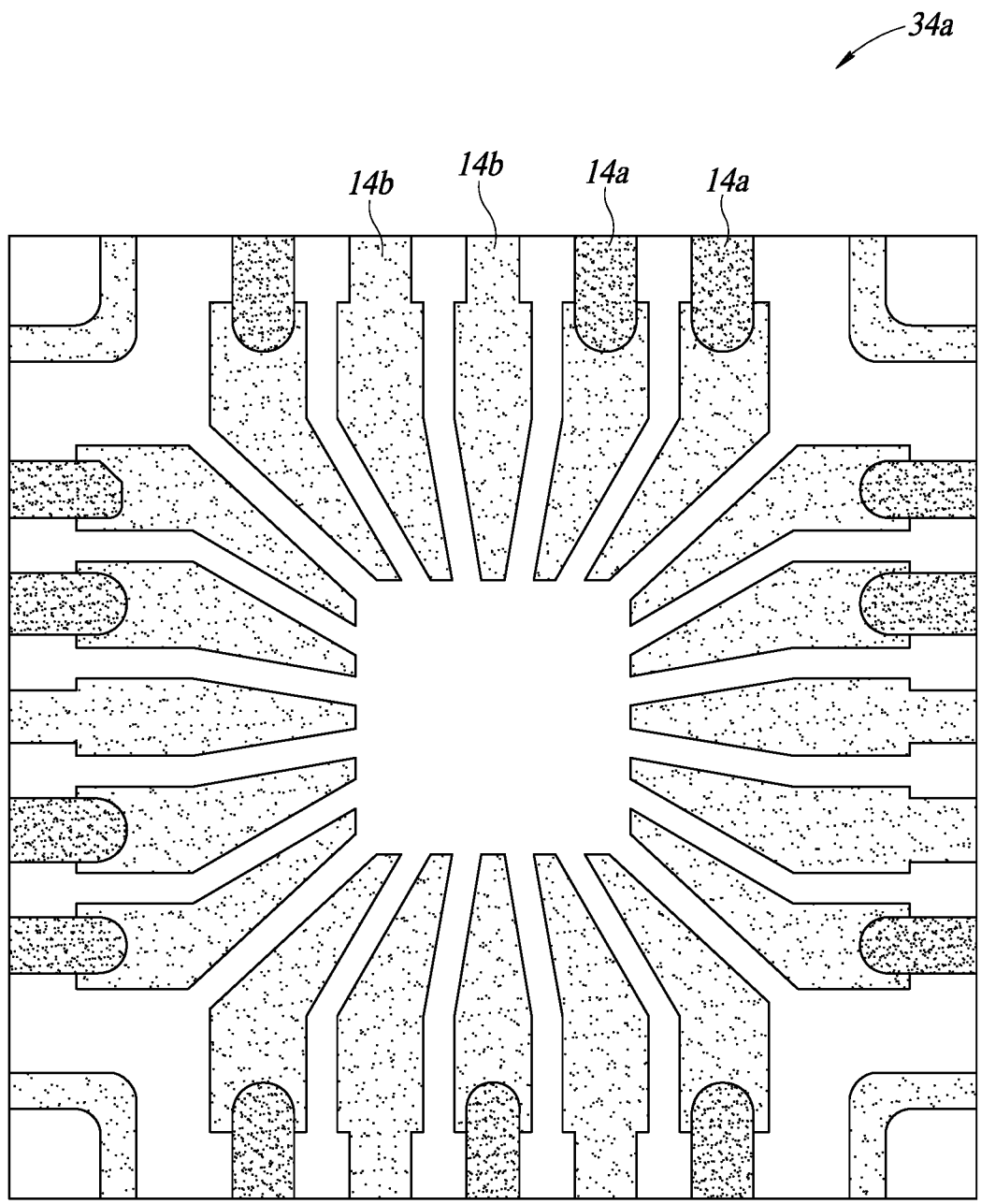
FIG. 3B is a bottom view of an individual leadframe of the leadframe array of FIG. 2B.

FIGS. 3A and 3B show close up views of the upper and lower surfaces, respectively, of an individual leadframe 34a. With reference to FIG. 3A, the upper surfaces of the leads 14, including active leads and inactive leads, of the individual leadframe 34 are in a same plane as indicated by the same volume of stippling. With reference to FIG. 3B, the lower surfaces of the inactive leads 14b and first portions of the active leads 14*a* of the individual leadframe 34 are in a same plane as indicated by the same volume of stippling. Outer portions of the active leads 14*a* are in a different plane as indicated by the increased volume of stippling. In particular, the outer portions of the active leads 14*a* are thicker and have surfaces in a plane that extends out of the page, relative to the inner portions of the active leads 14*a*.

FIGS. 4A and 4B illustrate various stages of manufacturing the leadframe array 34 of FIGS. 2A and 2B. The leadframe array 34 of FIG. 4A already has leads, however, the inactive leads have not yet been formed.

As shown in FIG. 4A, outers portions of the active leads 14*a* that are to form lands 31 of the active leads 14*a* are covered with a material so that the rest of the leads may be etched. In one embodiment, the active leads 14*a* are plated with one or more metal materials, such as Au, Ag, Ni/Pd/Ag, Ni/Pd/Au—Ag alloy, or Ni/Pd/Au/Ag, which thereby form the lands of the active leads 14*a*. In another embodiment, the outer portions of the active leads 14*a* are patterned with light sensitive materials as is well known in the art.

With reference to FIG. 4B, lower surfaces of the leads 14, of both the active leads 14*a* and inactive leads 14*b*, are etched using standard semiconductor etching techniques. In particular, inner portions of the active leads 14 are etched that do not include plated metal material or light sensitive material and entire surfaces of the inactive leads 14*b* are etched. The etching occurs to a depth of about one half the original thickness of the leadframe, also referred to as half etched. In one embodiment, the etching occurs to about 50% the original thicknesses of the leads. In other embodiments, the etching occurs to between 40% to 60% of the original thicknesses of the leads. After etching, each individual leadframe 34*a* of the leadframe array 34 includes an active lead 14*a* and an inactive lead 14*b* as shown in FIG. 1B.

Figure 4D:
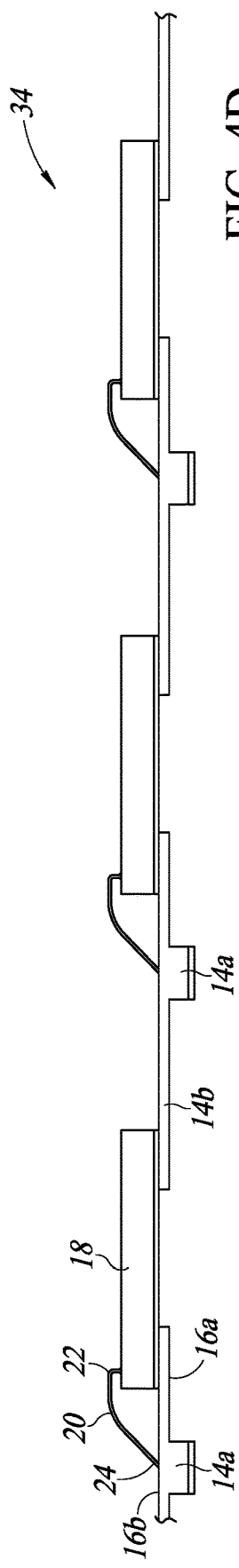
Figure 4E:
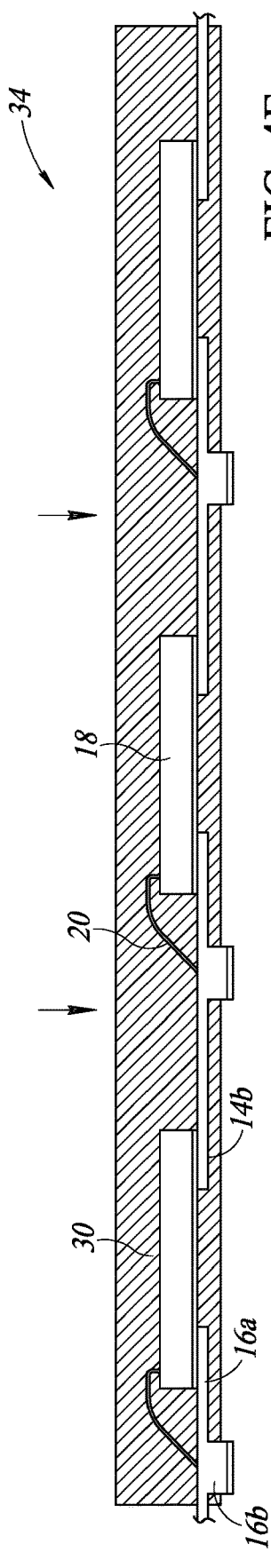
Figure 4F:
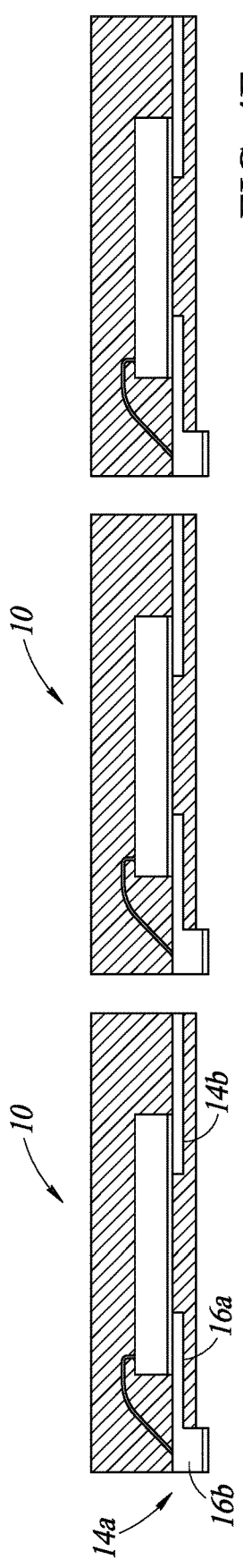

FIGS. 4C-4F illustrate various stages of assembling the semiconductor package of FIG. 1A in accordance with one embodiment. In particular, as shown in FIG. 4C, semiconductor dice 18 are coupled to inner portions 16*a* of the leads 14. In particular, the semiconductor dice 18 are coupled to inner portions 16*a* of the active leads 14*a* and inactive leads 14*b*. By providing both active leads 14*a* and inactive leads 14*b* for supporting each semiconductor die 18, the supporting structure for the semiconductor die is improved. Further, the symmetrical arrangement of the plurality of leads provides improved support for the semiconductor dice 18 during dice attachment. Additionally, leads of adjacent individual leadframes 34*a* are coupled together by connecting bars 36 and are able to provide improved support to each other during dice attachment.

With reference to FIG. 4D, the semiconductor dice 18 are electrically coupled to the active leads 14*a* in a bonding process. In particular, first ends 22 of conductive wires 20 are coupled to bond pads of the semiconductor die 18, and second ends 24 of the conductive wires 20 are coupled to outer portions 16*b* of the active leads 14*a*. The bonding process of coupling the conductive wires 20 may involve heat and ultrasonic energy. Although only one conductive wire is shown for each individual leadframe, it is to be understood that conductive wires are being coupled to other active leads and bond pads of the semiconductor dice not shown in FIG. 4D.

During the bonding process of coupling the conductive wires 20 to the active leads 14*a*, all of the leads 14, both the active leads 14*a* and the inactive leads 14*b*, provide stabilization. For instance, while ultrasonic energy is being applied during the bonding process, the stability of the leadframe that is created in part by the inactive leads, eliminates or reduces any bouncing effect the ultrasonic energy may introduce. In that regard, stronger bonds may be provided between the active leads 14*a* and the conductive wires 20.

As previously mentioned the quantity and location of active leads may be identified by a particular application for the semiconductor package, such as by a customer. However, the number of inactive leads may be selected by the amount of stabilization that is desired during manufacturing.

As shown in FIG. 4E, a package body 30 is formed on the semiconductor dice 18, the conductive wires 20, and portions of the plurality of leads 14 to form semiconductor packages. In at least one embodiment, the package body 30 is formed in a mold. In particular, the leadframe array 34 is placed in a mold and molding material, such as a resin, is introduced into the mold, as is well known in the art. In at least one embodiment, the molding material hardens in a curing step to form the package body 30.

As shown in FIG. 4E, the package body 30 forms over upper and lower surfaces of the inactive leads 14*b*. Outer portions 16*b* of the active leads 14*a* remain exposed from the package body 30 to form lands, while inner portions 16*a* of the active leads 14*a* at the lower surface are covered by the package body 30.

The assembly process further includes separating the semiconductor packages into individual packages 10. In particular, the dicing occurs at locations as indicated by the arrows as shown in FIG. 4E and separates the connected semiconductor packages into individual semiconductor packages 10 as shown in FIG. 4F. The dicing cuts through the connecting bars 36, the package body 30, and the leads to separate the semiconductor packages 10. The dicing method may be any method suitable to separate the semiconductor packages, including sawing and laser. Although not shown, the connected semiconductor packages may be secured to a support structure, such as tape, during the dicing step, as is well known in the art.

Upon dicing side surfaces of both the active and inactive leads 14*a*, 14*b* are exposed at the side surface of the individual semiconductor packages as shown in FIG. 1C.

The stages of manufacturing and assembly may occur in a different order as well. For instance, the leads may be half etched after the semiconductor die is coupled to the leadframe. Further, although the embodiments shown in the figures show the leads supporting the semiconductor, in other embodiments, the leadframe package includes a die pad that supports the semiconductor die.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising:
a plurality of leads having first ends spaced from second ends, the plurality of leads include:
a plurality of active leads that each include a first outer surface at the second end; and
a plurality of inactive leads that each include a second outer surface at the second end;
a semiconductor die having an active surface opposite a back surface, the back surface being coupled to the first ends of the plurality of leads, the semiconductor die including a plurality of bond pads on the active surface;
a conductive wire having a first end coupled to a first bond pad of the plurality of bond pads on the active surface and the conductive wire having a second end coupled to the second end of a first active lead of the plurality of active leads; and
a package body covering the semiconductor die, the conductive wire, and first ends of the plurality of leads, the first outer surfaces of the plurality of active leads are exposed from the package body, the second outer surfaces of the plurality of inactive leads are covered by the package body,
wherein the active surface of the semiconductor die is electrically decoupled from the plurality of inactive leads, wherein the plurality of inactive leads are electrically decoupled from an active surface of any other semiconductor dice in the semiconductor package,
wherein the plurality of inactive leads are exposed at respective side surfaces of the semiconductor package, and
wherein the plurality of inactive leads are coplanar with the package body at the respective side surfaces of the semiconductor package.

2. The semiconductor package of claim 1, wherein the plurality of inactive leads have thicknesses that are less than half the thicknesses of the second ends of the plurality of active leads.

3. The semiconductor package of claim 1, wherein the plurality of leads are symmetrically arranged about a first axis of the semiconductor die.

4. The semiconductor package of claim 3, wherein the plurality of leads are symmetrically arranged about a second axis, wherein the second axis is orthogonal to the first axis.

5. The semiconductor package of claim 1, wherein the plurality of active leads extend along respective side surfaces of the semiconductor package to the first surface of the semiconductor package.

6. A semiconductor package, comprising:
a plurality of active leads having first ends spaced from second ends, each second end has a first surface;
an inactive lead having a first end and a second end;
a semiconductor die having a back surface that is opposite to an active surface, the first ends of the plurality of active leads coupled to the back surface, and the first end of the inactive lead coupled to the back surface, the semiconductor die including a plurality of bond pads on the active surface;
conductive wires having first ends coupled to the plurality of bond pads on the active surface, and the conductive wires having second ends opposite the first ends coupled to the first surface of the second ends of the plurality of active leads; and
a package body over the conductive wires, the semiconductor die, the inactive lead, and portions of the plurality of active leads,
wherein the active surface of the semiconductor die is electrically decoupled from the inactive lead, wherein the inactive lead is electrically decoupled from an active surface of any semiconductor dice in the semiconductor package,
wherein the inactive lead is exposed at a side surface of the semiconductor package, and
wherein the inactive lead is coplanar with the package body at the side surface of the semiconductor package.

7. The semiconductor package of claim 6, wherein second surfaces opposite the first surfaces of the second ends of the plurality of active leads are exposed from the package body and form lands.

8. The semiconductor package of claim 7, wherein inner and outer portions of the inactive lead are covered by the package body.

9. The semiconductor package of claim 6, wherein the first end of the inactive lead has a thickness that is less than thicknesses of the first ends of the plurality of active leads.

10. The semiconductor package of claim 9, wherein the first end of the inactive lead has a thickness that is less than half of the thicknesses of the first ends of the plurality of active leads.

11. The semiconductor package of claim 6, comprising a plurality of inactive leads, wherein the plurality of inactive leads and the plurality of active leads are symmetrically arranged about at least one axis.

12. A semiconductor package, comprising:
a plurality of leads having first ends and second ends, wherein the plurality of leads include a plurality of active leads and a plurality of inactive leads;
a semiconductor die having a back surface and an active surface, the active surface being opposite the back surface, the back surface being coupled to the plurality of leads such that the back surface of the semiconductor die abuts against the first ends of the plurality of leads, the plurality of leads symmetrically arranged about the semiconductor die, the semiconductor die including a bond pad on the active surface;
a conductive wire coupled between the bond pad and the second end of one of the plurality of active leads; and
a package body covering the semiconductor die, the conductive wire, and first ends of the plurality of leads, wherein the second ends of the plurality of active leads are exposed from the package body and form lands, wherein the second ends of the plurality of inactive leads are covered by the package body,
wherein the active surface of the semiconductor die is electrically decoupled from the plurality of inactive leads, wherein the plurality of inactive leads are electrically decoupled from an active surface of any other semiconductor dice in the semiconductor package.

13. The semiconductor package of claim 12, wherein the plurality of inactive leads have thicknesses that are less than half the thicknesses of the second ends of the plurality of active leads.

14. The semiconductor package of claim 12, wherein the plurality of leads are symmetrically arranged about a first axis of the semiconductor die.

15. The semiconductor package of claim 14, wherein the plurality of leads are symmetrically arranged about a second axis, wherein the second axis is orthogonal to the first axis.

16. The semiconductor package of claim 12, wherein the plurality of inactive leads are exposed at respective side surfaces of the semiconductor package.

17. The semiconductor package of claim 16, wherein the plurality of inactive leads are coplanar with the package body at the respective side surfaces of the semiconductor package.

18. The semiconductor package of claim 16, wherein the plurality of active leads extend from respective side surfaces of the semiconductor package.

* * * * *